United States Patent [19]

Prakash

[11] Patent Number: 5,225,792

[45] Date of Patent: Jul. 6, 1993

[54] OSCILLATOR CIRCUIT HAVING MEANS FOR SWITCHING BETWEEN OSCILLATOR CONFIGURATIONS

[75] Inventor: Chacko Prakash, Penang, Malaysia

[73] Assignee: Motorola, Inc., Schaumburg, Ill.

[21] Appl. No.: 786,637

[22] Filed: Nov. 1, 1991

[51] Int. Cl.⁵ .......................... H03B 5/36; H04B 1/10
[52] U.S. Cl. .................................... 331/158; 331/179; 455/310
[58] Field of Search ........... 331/154, 158, 175, 116 R, 331/116 FE, 117 R, 117 FE, 117 D, 179; 455/310, 63, 150.1

[56] References Cited

U.S. PATENT DOCUMENTS 4,378,532  3/1983  Burgoon .............................. 331/158
4,987,388  1/1991  Prakash et al. ..................... 331/158

Primary Examiner—David Mis
Attorney, Agent, or Firm—M. Mansour Ghomeshi

[57] ABSTRACT

An oscillator circuit (200) is provided having a crystal oscillator (202) operating in a first oscillator mode to produce an oscillator output signal (201). The oscillator output signal (201) has a desired frequency of operation. The oscillator circuit (200) also includes switches (206A and 206B) for selectively forcing the crystal oscillator (202) to operate in a second oscillator mode in order to shift the frequency of the oscillator output signal (201).

3 Claims, 2 Drawing Sheets

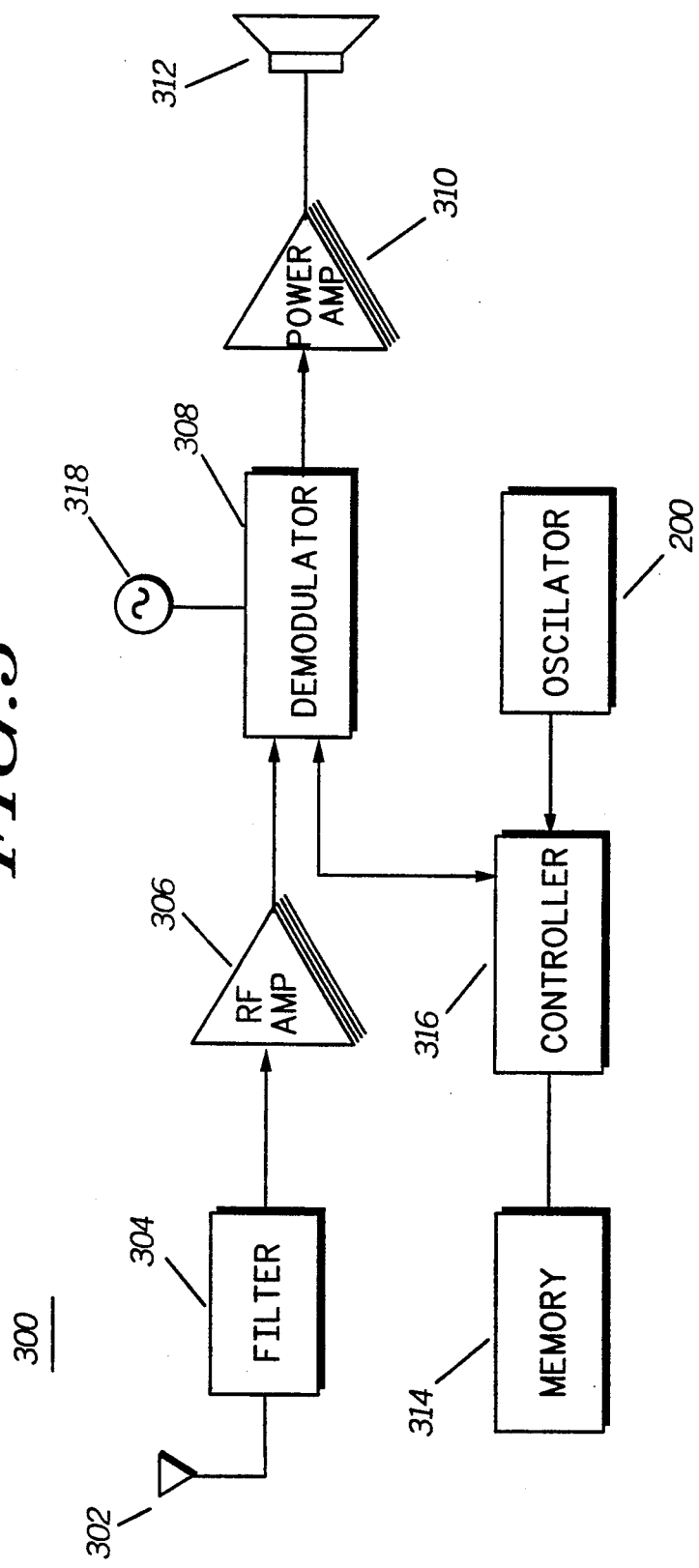

OSCILLATOR CIRCUIT HAVING MEANS FOR SWITCHING BETWEEN OSCILLATOR CONFIGURATIONS

FIELD OF THE INVENTION

This invention relates generally to oscillator circuits and more specifically to crystal oscillator circuits.

BACKGROUND OF THE INVENTION

As more specific operational and performance demands are made on radio communication devices, a larger number of clock dependent components, such as micro controllers are used. In general, a micro-controller executes a pre-determined algorithm using a clock reference signal. The clock reference signal is generated by an oscillator circuit having a crystal oscillator. These oscillator circuits generally produce harmonics of several orders. These harmonics, albeit at low levels, generally interfere with the operation of the communication devices in which they operate. Harmonics having frequencies close to the operating frequencies of receivers fool such receivers to think that they are signals to be received. Under these conditions the receiver unquiets and proceeds to receive the signal. This phenomenon is known as self quieting in the radio communication industry and is very annoying to the user. In general, self quieting occurs when the receiver receives a harmonic of the micro-controller clock frequency and processes that as if it where a valid received signal, thereby quieting itself (hence the name self quieting). Detection circuitries in the form of filters have been designed to stop this phenomenon. The success of these filters is limited for they can only be designed to filter a particular signal and not all harmonics. One method of curtailing this self-quieting problem is implemented by a circuit shown in FIG. 1.

Referring to FIG. 1, an oscillator circuit 100 is shown to include an amplifier 112 and a crystal 110. Also shown are resistor 118, and capacitors 114 and 116 as gain control elements. These are the necessary elements to produce oscillation. A switch 102 comprising an inductor 104 and a transistor 106 is included in the path of the crystal 110 to provide a shift of the output frequency, when desired. In a general sense, the output 120 produces a signal based on the frequency of the operation of the crystal 110. In the event that this signal is on the frequency of the receiver in which this oscillator is operating, the switch 102 under the control of the control line 108, is turned on resulting in the addition of the inductor 104 in the path of the crystal 110. With the induction of the inductor 104 added to the reactance of the circuit 100 and the stiff nature of the quartz crystal 110, the frequency of the output signal 120 shifts by a predetermined value. In general, however, this value is not sufficient to avoid self quieting problems. In low band applications where a more significant shift in terms of parts per million of frequency is desired, this solution comes short of meeting its desired objectives. An improved oscillator circuit is therefore desired having means to shift the frequency of the output signal by a sufficient amount.

SUMMARY OF THE PRESENT INVENTION

An oscillator circuit is provided having a crystal oscillator operating in a first oscillator mode to produce an oscillator output signal. The oscillator output signal has a desired frequency of operation. The oscillator circuit also includes a means for selectively forcing the crystal oscillator to operate in a second oscillator mode in order to shift the frequency of the oscillator output signal.

BRIEF DESCRIPTION OF THE DRAWINGS

FIG. 3, shows a block diagram of a communication device in accordance with the principles of the present invention.

DETAILED DESCRIPTION OF THE PREFERRED EMBODIMENT

Past attempts to prevent receiver self-quieting caused by oscillator interference have not had much of success. Their lack of success is mainly due to their frequency shift methods which has been inadequate. Since the operation of crystal oscillators depends strongly on the crystal, a minor change in the path of the crystal results in an appreciable degree of frequency shift. Consequently, these attempts have produced limited and insufficient shifts rendering their use limited to particular circuits and frequencies. The present invention, however, provides a method of shifting the output frequency of an oscillator by changing the entire configuration of the oscillator, hence producing sufficient frequency shift.

Figure 1:
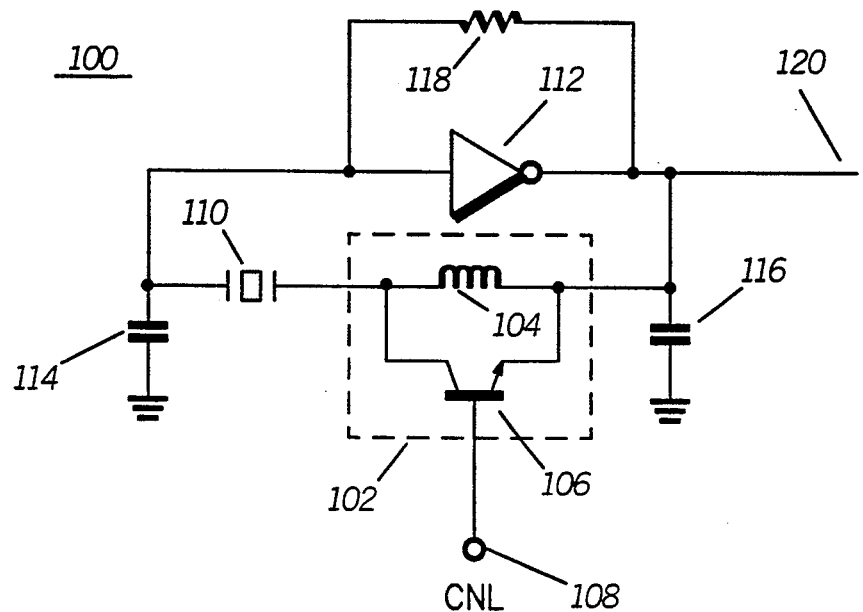
FIG. 1, shows an oscillator circuit employing a present scheme of shifting the frequency of an oscillator output signal.
Figure 2:
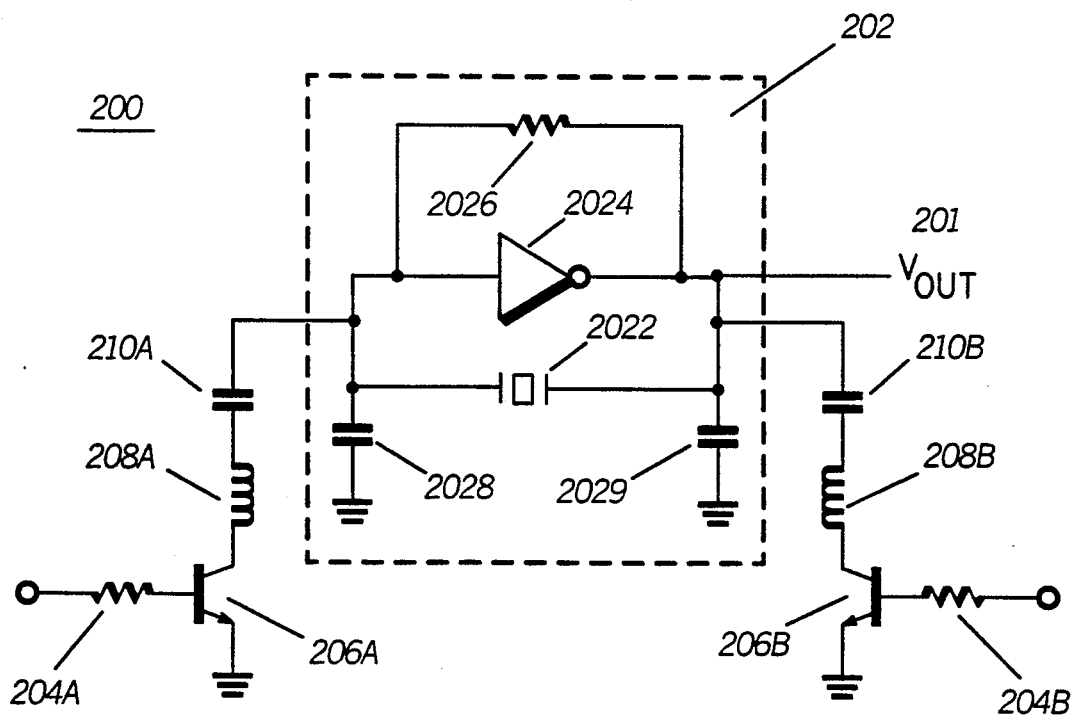
FIG. 2, shows an oscillator circuit diagram in accordance with the principles of the present invention.

Referring now to FIG. 2, an oscillator circuit 200 is shown in accordance with the principles of the present invention. The circuit 200 includes an oscillator block 202 configured to operate in the Colpitts mode. In this mode, as can be seen, a crystal 2022 is placed in parallel with an amplifier 2024. Also in parallel with the crystal 2022 is a resistor 2026 which provides control over the gain of the amplifier 2024. Capacitors 2028 and 2029 provide compensation and gain control for the oscillator 202. As is well known in the art, the crystal 2022 is operating in an inductive mode in order to produce an oscillator output signal at the $V_{out}$ 201. Colpitts oscillators and their operation are well known in the art. In accordance with the present invention, two switching networks are coupled to the input and output of the amplifier 2024. The switching networks are identical and each includes a capacitor (210A, 210B), an inductor (208A, 208B), and a transistor switch (206A, 206B) with biasing resistor 204A and 204B. A control signal for the transistors 206A, 206B is received at the base through the resistors 204A and B. In normal operation, the two transistors 206A and 206B are in the OFF state disconnecting the inductors 208A and 208B from the oscillator 202. Therefore, the frequency of the signal $V_{out}$ at terminal 201 remains intact. When a shift in this frequency is desired, the transistors 206A and 206B are turned ON, allowing the capacitors 210A, 210B and inductors 208A and 208B to become part of the oscillator circuit. In so doing, the configuration of the oscillator 202 changes from a Colpitts to a Hartley oscillator, thereby appreciably shifting the frequency of $V_{out}$ by a desired amount. Note that by changing the configuration of the oscillator 202, a more significant shift in the output frequency can be realized.

Referring now to FIG. 3, a block diagram of a communication device 300 is shown in accordance with the principles of the present invention. The receiver 300 includes an antenna 302 by which radio frequency signals are received and applied to a filter 304 for filtering. Filtered signals are amplified by an RF amplifier 306 and applied to a demodulator 308. The operation of the demodulator 308 is controlled by a controller 316 which is operating on the oscillator 200. The controller 316 comprises such well known devices as Digital Signal Processors and micro-computers. Coupled to the controller 316 is a memory block 314 that provides the controller with frequency information and other information relevant to the operation of the receiver 300. The demodulator 308 uses the oscillator signal of an oscillator 318. The oscillator 318 determines the operating frequency of the receiver 300. The output of the demodulator 308, is coupled to a power amplifier 310 where audio signals are amplified and applied to a speaker 312. A display, not shown in this embodiment, may be included in the receiver 300 to present data information to the user. This display would be controlled by the controller 316 and coupled to the output of the demodulator 308 where data signal are available.

As in any other oscillator, the circuit 200 produces a number of harmonics at a variety of frequencies. These harmonics can easily be picked up the antenna 302 or may be internally coupled to the demodulator 308. Such undesired coupling of these harmonics causes the receiver 300 to quiet as if a legitimate signal was being received. These harmonics are continuously present so long as the oscillator 200 is functioning. Their frequency depends on the frequency of the oscillator 200. Interference and self quieting occurs when the frequency of any of these harmonics falls on the frequency of operation of the receiver 300. That is, when they pass through the elements of the receiver 300 as legitimate signals and cause it to quiet. It is obvious that it is the combination of the operating frequency of the receiver 300 and the harmonic frequency that results in self quieting. Information on these interfering harmonics and their frequency relationship to the various operating frequencies of the receiver 300 are stored in the memory 314. This information is normally retrieved at start up and is known to the controller 316. This information is helpful in preventing interference since the controller 316 sets or is essentially aware of the operating frequency of the receiver 300. When the controller 316 determines that such harmonics will cause interference with the operating frequency, a command is sent to switches 206A, 206B in the oscillator 200 to turn on causing the operating mode of the oscillator 200, and hence a shift in its operating frequency. This shift in frequency causes harmonics to shift as well, thereby minimizing their effects on the particular frequency of operation of the receiver 300. In other words by activating the two switches 206A and 206B, the configuration of the oscillator 200 changes resulting in a desirable shift in the oscillator frequency applied to the controller 316. It is significant to note that subtle changes in the frequency of operation of the oscillator 200 do not affect the operation of the controller 316. This is mainly due to algorithm timing tolerances which are well known in the art.

By allowing the frequency of operation of the oscillator 200 to change, its harmonics will no longer reside on the exact frequency of operation of the receiver 300. With the removal of these harmonics, the receiver 300 will less likely be susceptible to such interferences and instances of self-quieting will greatly be reduced. A significant benefit is that such change or shift in the frequency of the oscillator 200 is under the control of the controller 316. With the oscillator 200 and its associated switches, shifts of 1000 parts per million (ppm) are possible and such shifts are adequate for low band receivers and obviously adequate for receivers operating at higher frequencies. Note that the oscillator configurations utilizing crystals in either series or parallel resonance could also be used in the oscillator architecture 200. The specific configuration mentioned in this application are to signify the principles of the present invention and not to provide limitations thereof.

To summarize, an oscillator circuit is disclosed for use with controllers and micro-computers in receivers. The oscillator switches between two configuration modes in order to shift the output frequency applied to the controller. This shift in the frequency minimizes the self-quieting effects that certain frequencies have on the receiver. Information on those frequencies is stored in a memory that is coupled to the controller. The controller changes the frequency on which it operates in order to reduce receiver interference when the frequency of the receiver is one where interference is anticipated.

Although in the preferred embodiment the oscillator 202 is shown to operate in a Colpitts configuration and changing this configuration to Hartley, it is also possible to have the oscillator 202 operating in any first configuration and changing to any second configuration. The presentation of the oscillator 200 and its particular configuration is intended to illustrate the principles of the present invention as described in the preferred embodiment. It is not, however, to be construed as limitations on the present invention.

Those skilled in the art will recognize that various modifications and changes could be made with respect to the above described invention, without departing from the spirit and scope of the invention as set forth. Therefore, it should be understood that the claims are not to be considered as limited to the particular embodiments set forth in the absence of specific limitations expressly incorporating such embodiments.

What is claimed is:

1. An oscillator circuit, comprising:
    a crystal oscillator operating in a Colpitts configuration to produce an oscillator signal having a frequency; and
    switching means for selectively switching the configuration of the crystal oscillator to Hartley in order to shift its frequency, the switching means includes capacitive and inductive elements to cause an appreciable shift in the frequency.

2. In a receiver operating on a receive frequency and having a controller oscillator operating on a clock frequency, a method of minimizing interferences on the receive frequency caused by the clock frequency, comprising the steps of:
    generating a signal on the clock frequency using a Colpitts oscillator configuration; and
    selectively shifting the clock frequency by switching in inductive and capacitive elements to force the controller oscillator to operate in a Hartley configuration.

3. A receiver, comprising:
    receiver means for receiving a radio communication signal;
    controller means for controlling the operation of the receiver means, the controller means having a clock input signal operating on a clock frequency;

an oscillator circuit for producing the clock input signal using a Colpitts oscillator mode; and
a switching circuit for selectively switching capacitive and inductive elements into the oscillator circuit to change the mode of operation of the oscillator circuit to Hartley in order to shift the clock frequency and prevent the clock input signal from interfering with the receiver means.

* * * * *